US006946841B2

(12) United States Patent
Rubashov (10) Patent No.: US 6,946,841 B2
(45) Date of Patent: Sep. 20, 2005

(54) APPARATUS FOR COMBINED NUCLEAR IMAGING AND MAGNETIC RESONANCE IMAGING, AND METHOD THEREOF

(76) Inventor: Igor Rubashov, 9336 Hazen Dr., Beverly Hills, CA (US) 90210

( * ) Notice: Subject to any disclaimer, the term of this patent is extended or adjusted under 35 U.S.C. 154(b) by 0 days.

(21) Appl. No.: 10/223,589

(22) Filed: Aug. 19, 2002

(65) Prior Publication Data

US 2003/0090267 A1 May 15, 2003

Related U.S. Application Data

(60) Provisional application No. 60/313,246, filed on Aug. 17, 2001.

(51) Int. Cl.[7] ............................................. G01V 3/00
(52) U.S. Cl. ...................................................... 324/318
(58) Field of Search ............................... 324/300, 307, 324/309, 318; 600/410, 411

(56) References Cited

U.S. PATENT DOCUMENTS

| 4,939,464 | A | * | 7/1990 | Hammer ..................... 324/318 |
| 4,945,478 | A | * | 7/1990 | Merickel et al. ............ 382/131 |
| 5,600,144 | A | | 2/1997 | Worstell |
| 5,719,400 | A | | 2/1998 | Cherry et al. |
| 5,782,764 | A | * | 7/1998 | Werne ........................ 600/411 |
| 6,060,883 | A | * | 5/2000 | Knuttel ....................... 324/318 |

FOREIGN PATENT DOCUMENTS

WO   WO 2003003038   *  1/2003

OTHER PUBLICATIONS

Raylman et al.; "Combined MRI–PET Scanner: A Monte Carlo Evolution of the Improvements in PET Resolution Due to the Effects of a Static Homogeneous Magnetic Field"; Aug. 1996; IEEE; IEEE Transaiction of Nuclear Science, vol. 43, No. 4; pp 2406–2412.*

Shao et al.; "Developmetn of a PET Detector System Compatible with MRI/NMR Systems"; Jun. 1997; IEEE; IEEE Transactions on Nuclear Science, vol. 44, No. 3; pp. 1167–1171.*

Hammer, Engineering COnsiderations for a MR–PET Scanner, Physica Media—vol. XII, Suplement 1, Jun. 1996. US.

Raylman, Combined MRI–PET Scanner: a Monte Carlo Evaluation of the Improvements in PET Resolution Due to the Effects of a Static Homogeneous Magnetic Field, IEEE Transactions on Nuclear Science, vol. 43, Aug. 1996. US.

Farahani, Contemporaneous Positron Emission Tomography and MRI Imaging at 1.5T, Journal of Magnetic Resonance Imaging 9:497–500, 1999. US.

Slates, A Study of Artefacts in Simultaneous PET and MR imaging using a prototype MR compatible PET Scanner, Phys. Med. Bio. 44 (1999) 2015–2027. UK.

Shao, Development of a PET Detector System Compatible with MRI/NMR Systems, IEEE Transactions on Nuclear Science, vol. 44, No. 3, Jun. 1997. US.

Shao, Simultaneous PET and MR Imaging, Phys. Med. Biol. 42 (1997) 1965–1970. UK.

* cited by examiner

*Primary Examiner*—Brij B. Shrivastav
*Assistant Examiner*—Dixomara Vargas
(74) *Attorney, Agent, or Firm*—Frederic Farina (57) ABSTRACT

A combined MR and nuclear imaging device comprising an MRI device and an nuclear imaging device, wherein the nuclear imaging device is capable of operating with the magnetic field of the MRI device or in a region where the magnitude of the magnetic field is lesser. The combined system allows MRI examination and nuclear medicine examinations to be conducted quasi-simultaneously with no or minimal motion of the patient during the combined examination. The nuclear imaging device comprises nuclear detector modules capable of operating within a large magnetic field when the modules oriented in the direction of the field, and capable of operating in any direction when the magnitude of the field is below a certain threshold.

18 Claims, 9 Drawing Sheets

APPARATUS FOR COMBINED NUCLEAR IMAGING AND MAGNETIC RESONANCE IMAGING, AND METHOD THEREOF

CROSS REFERENCE TO RELATED APPLICATIONS

This application claims the benefit of U.S. Provisional Patent Application No. 60/313,246 filed on Aug. 17, 2001, the content of which is herein incorporated by reference.

BACKGROUND

The present invention relates top the field of diagnostic imaging, and in particular the fields of nuclear imaging and Nuclear Magnetic Resonance (NMR) imaging.

In nuclear imaging, a radiopharmaceutical is introduced into the body of a patient. As the radiopharmaceutical decays, gamma rays are generated. The generated gamma rays are detected and used to construct a useful image. Positron Emission Tomography (PET) is a branch of nuclear medicine in which a positron-emitting radiopharmaceutical is introduced into the body of a patient. Each emitted positron reacts with an electron in what is known as an annihilation event, thereby generating a pairs of 511 KeV gamma rays emitted in opposite directions. Other examples of nuclear medicine devices include gamma cameras and Single Photon Emission Complete Tomography (SPECT) systems.

In NMR imaging, pulses of radio frequency energy are applied to the subject in the presence of an applied magnetic field. Under the influence of the radio frequency pulses, the magnetic moments of nuclei in the material of the subject are caused to precess about the direction of the applied magnetic filed to give detectable radio frequency signals. By mapping the difference between the radio frequency signals produced in different parts of a selected region of the subject, e.g. a slice through the subject, an image of the selected region of the subject may be obtained.

Nuclear imaging technology, such as gamma cameras and SPECT, is widely used in medicine. For example, in the detection of breast cancer, nuclear medicine (and particularly scintimammography), allows to distinguish cancerous tissue from healthy tissue. However, in many cases, the space resolution of the images obtained is not sufficient, and smaller features (typically less than 1.5 cm) cannot be detected. It would be thus very useful in the detection of very early stage tumors if one could increase the resolution of Nuclear medicine technology.

On the other hand, the space resolution achieved with MR imaging is much higher. But unfortunately, its ability to distinguish different tissues is very low. In particular, MR imaging does not allow to distinguish between benign and malign tumors.

In sum, typically, the MR imaging produces images in which anatomical structures are clearly visible, whereas nuclear imaging using devices such as gamma cameras, produces images in which the specificity of tissues can be characterized.

In view of the above, one can easily appreciate the advantages of combining the two methods, MR imaging and nuclear imaging. Ideally, the combined system would have the space resolution provided by MRI technology and also the specificity of nuclear imaging technology.

One could imagine two main approaches to combining these two very different technologies. In a first approach, MR images and Nuclear images are taken separately and the resulting images are combined in a post-processing step. In a second approach, the MRI device and the Nuclear device are combined into a single device, and both MR and Nuclear images are acquired simultaneously or quasi-simultaneously.

In line with the first approach, the particular combination of MR imaging and scintimammography (gamma camera) in a single image is implemented using the so-called "fusion image" technique. In fusion image, Nuclear images and MR images are acquired independently from one another. In a post-processing step, Nuclear images and MR images are overlaid to form "fusion" images or combined images. However, this technique does not eliminate the main shortcomings of each of these methods such as low spatial resolution and low signal-to-noise ratio for nuclear imaging and low specificity for MR imaging. The fact that fusion images retain or even enhance the problems of Nuclear and MR images is not surprising. Indeed, the images used to obtain a fusion image are acquired with completely different systems (Nuclear and MR) with no common coordinate systems, and thus images to be "fused" have different scales and projections. The "marker" method is generally used in conjunction with the fusion image technique. However, this "marker" method is not very precise and the images obtained are noisy.

The difficulty in combining Nuclear and MR images is compounded by the fact that the positions of the patient in nuclear imaging devices and MR devices are completely different. Further, Nuclear images and MR images are taken at different times and the time interval between images can be important (days to weeks).

One way to eliminate the above-mentioned problems, and in particular problems arising from the different coordinate systems and the difference in the position of the patient, would be to acquire Nuclear images and MR images simultaneously (or quasi-simultaneously in a biological time scale) with a combined Nuclear-MRI device, as suggested by the second approach mentioned earlier.

This was most successfully accomplished by combining a PET device and a CT scanner. This machine is the first medical imaging device to simultaneously and clearly reveal both, anatomical details, and metabolic processes within the body. The use of this combined machine in medicine is growing fast.

Because the MRI devices allow to see finer anatomical details (higher space resolution) than CT scanners, it would be advantageous to combine an MRI device with a Nuclear imaging device.

One of the main problems with attempting to combine nuclear imaging technology with MRI technology lies the in the sensitivity of the nuclear imaging device to strong magnetic fields. In particular, in the current state of the art, the photodetector module of a nuclear medicine device will not function properly if placed within a magnetic field. Indeed, virtually all existing nuclear imaging devices use photomultipliers (PMTs), and PMTs are very sensitive to magnetic fields. Because of this, direct combination of MRI-nuclear imaging cannot be accomplished in the same fashion as the CT-Nuclear combination.

In theory, solid-state photodetectors may be used in lieu of PMTs, since these photodetectors are immune to magnetic fields. However, solid-state photodetectors, including avalanche detectors are not fast enough and do not have the sensitivity required for Nuclear medicine applications. U.S. Pat. No. 4,939,464 discloses NMR-PET scanner apparatus wherein a PET detector is disposed within a magnetic imaging structure of an NMR device. To avoid interaction between the photodetector (specifically the photomultiplier tubes or PMT) of the PET detector, with the magnetic field generated by the magnetic imaging structure, the output of the PET detector is channeled to photodetectors that are shielded from the magnetic field.

U.S. Pat. No. 5,719,400 by Shao et al. discloses a high resolution detector array for gamma ray imaging, wherein the Mutlichannel PMTs (MC-PMTs) are capable of properly functioning in magnetic fields of up to 10 mT. This invention allowed Shoa et al. to combine an MRI device with a single-slice PET scanner, the PET scanner using LSO crystals optically coupled to three MC-PMTs each disposed about 4 m away from the center of the magnetic field. In this region, the magnetic field falls below a certain magnitude which is adequate for proper functioning of the MC-PMTs. The work of Shoa et al. demonstrated that it may be possible to achieve simultaneous acquisition of PET and MRI images without noticeable quality loss in either the PET or MR images.

However, the Shoa et al. system has limitations which do not allow to exploit the full potential of a combined nuclear imaging-MRI system. Some of these limitations are listed below:

Because of the length of the optic fibers used (up to 4 m), large losses of light occur in the fibers.

A compact device cannot be made since the PMTs have to be placed away (up to 4 m) from the rest of the device.

The 8 elements of the detector are located directly in the RF coil of the MRI device and magnetic interference cannot be prevented.

Insufficient main magnet field screening.

Ineffective image reconstruction technique (back projection).

MC-PMTs are very expensive.

What is needed is a combined MR-nuclear imaging device which is relatively compact and that can quasi-simultaneously acquire both MR and Nuclear images. Further, it is needed a Nuclear device which is immune to magnetic fields so that a functional combined MR-nuclear imaging device may be built.

SUMMARY

In one aspect, the present invention relates to a combined MR-nuclear imaging system wherein the nuclear imaging device is positioned within the magnetic field of the MRI device. The nuclear imaging device may have a fixed position within the magnetic field of the MRI device, or alternatively, the nuclear imaging device may be allowed a range of motion within the magnetic field.

In another aspect, this invention relates to a combined MR-nuclear imaging system wherein the nuclear imaging device includes a photodetector which is capable of functioning within a magnetic field.

In one embodiment, the photodetector includes a scintillator stage which receives gamma quantums and outputs photons, a light guide stage where the photons are channeled into a hybrid photodetector (HPD) where the photons are converted into electrons and which an electrical current representative of the gamma quantums received by the scintillator.

In yet another aspect, this invention provides a hybrid image reconstruction method where MR images and Nuclear images are combined to form a hybrid image.

In yet another aspect, the present invention provides a pulse shape analyzer and method for improving the precision of the impulse calculation.

DETAILED DESCRIPTION

Nuclear Imaging Device Capable of Operating Within a Magnetic Field

In one aspect, the present invention provides a nuclear imaging device capable of operating within a magnetic field. In order to achieve this, the conventional PMT generally used as photodetector is replaced with a hybrid photodetector combined with a scintillator into one nuclear detector module.

Generally, detectors used in nuclear imaging include two main stages. Within the first stage, gamma quantums emitted by the body part which is being imaged (after the patient has been injected with radioactive material) are transformed into photons of light. Within the second stage, the light received is transformed into an electrical signal. In a conventional nuclear imaging device, the transformation of gamma quantums into light takes place within a scintillator and the transformation of light into the electrical signal is performed by a PMT. Typically, the scintillator and the PMT are consolidated into one device. However PMTs are sensitive to magnetic fields, and therefore a conventional nuclear imaging device such as a conventional PET, cannot operate within a magnetic field.

In accordance with the present invention, a nuclear detector module is provided which, in certain configurations, is immune to magnetic fields.

Figure 4:
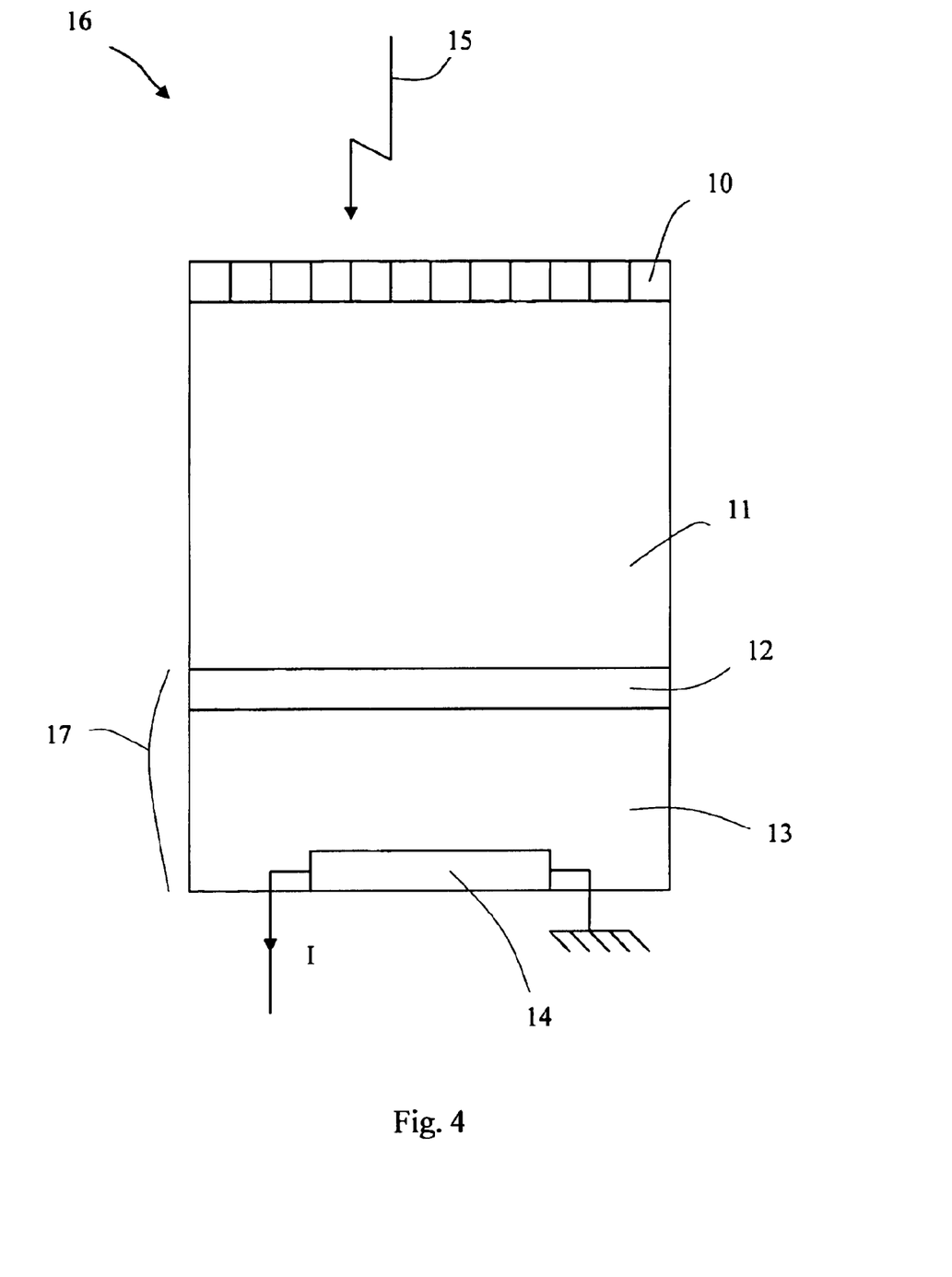
FIG. 4 is a schematic representation of a first embodiment of a Nuclear Detector Module (NDM) in accordance with the present invention.

FIG. 4 is a schematic representation of an embodiment of the nuclear detector module (NDM) 16 of the present invention. NDM 16 includes a scintillator module 10 which converts each gamma quantum received into a plurality of photons, a light guide module 11 which channels the photons to a hybrid photodetector (HPD) 17. The HPD comprises a photocathode 12, a vacuum electron tube 13, and an avalanche photocathode (APD) 14. The HPD also comprises accelerating electrodes (not shown). The photons exiting the light guide are received by photocathode 12 which outputs photoelectrons. The photoelectrons are accelerated in the vacuum tube 13 by a high-intensity electric field to directly strike the APD 14 where the electrons are multiplied and an electrical current is generated. Adequate HPDs are available commercially and are manufactured by HAMAMATSU PHOTONICS, Japan (www.hamamatsu.com). In particular HPD R7110U-40 may be used.

Under certain conditions, HPDs have the property of being immune to magnetic fields. Specifically, HPDs are immune to magnetic fields that have a direction nearly parallel to the direction in which photoelectrons travel within the HPD. Further, when the intensity of the magnetic field is small (but not zero), the HPD is immune to magnetic fields regardless of the direction of the fields.

From this property of the HPDs, one can imagine at least two configurations for a combined MR-nuclear imaging device. One in which NDMs 16 are disposed within the magnetic field of the MRI device, and are further disposed such that the direction of the field is approximately parallel to the direction of travel of the photoelectrons in the HPD. And one configuration where the NDMs 16 are positioned outside the main field of the MRI device where the magnetic field falls below a certain intensity. In the latter case, the NDMs may have any orientation since they are immune to the influence of the magnetic field.

Figure 5:
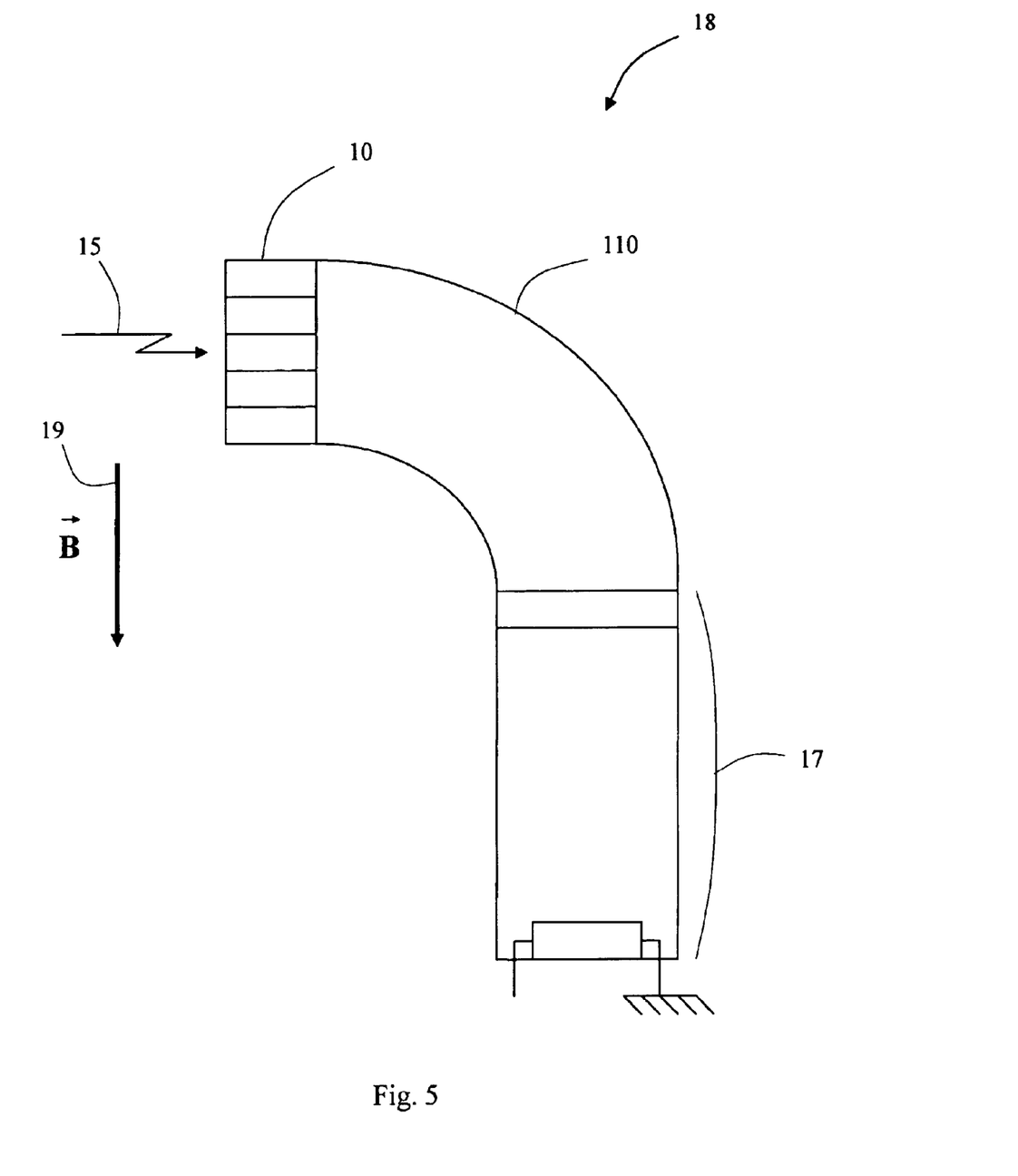
FIG. 5 is a schematic representation of a second embodiment of an NDM in accordance with the present invention.

In the first configuration, NDMs such as the one shown in FIG. 5 are preferably used. Since the gamma quantums 15 to be measured travel in a generally horizontal direction (within a few degrees), the plane of the scintillator 10 which receives the gamma quantums 15 is preferably generally vertical. However, the magnetic field 19 of the MRI device has a vertical direction. Therefore, in order to align the field 19 with the travel direction of photoelectrons within HPD 17, a 90°-turn light guide 110 is preferably used. With such a light guide 110, the HPD 17 may be positioned such that the photoelectrons travel direction in nearly aligned with the field 19, and the NDM 18 is immune from the influence of the magnetic field.

Figure 6:
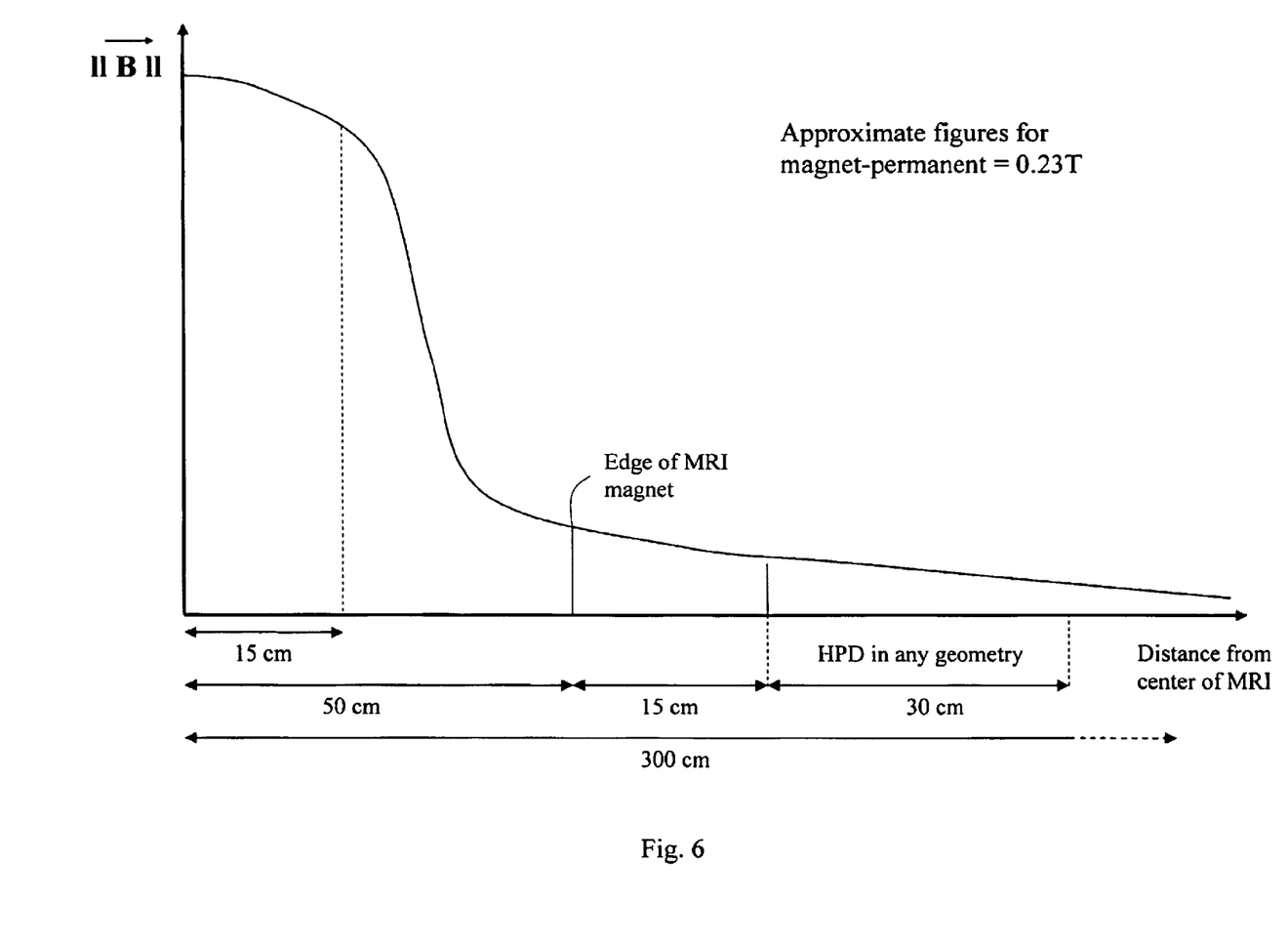
FIG. 6 is a graph showing the magnitude the MRI magnetic field as a function of distance form the center of the field.

In the second configuration, NDMs are disposed outside the main magnetic filed of the MRI, but at a distance small enough not to compromise the compactness of the combined MR-nuclear imaging device. FIG. 6 shows a coarse approximation of the profile of the magnetic field of an MRI device having a magnet at 0.23 T. In this particular case, placing the NDMs at a distance greater than about 10 cm to 20 cm, preferably around 18 cm, from the edge of the magnet is sufficient to allow the use of NDMs in any geometry (i.e., not necessarily aligned with the magnetic field). Note that the PMTs of the prior art would have to be placed at least 3 m away from the edge of the magnet, completely compromising the compactness of the combined MR-Nuclear device.

Description of the Combined Nuclear-MR Imaging Device and Method Thereof

The combined Nuclear-MR imaging device is described below in the particular case where the nuclear imaging system is a PET and the overall purpose of the combined system is for mammalian breast imaging. However, the ideas and principles herein disclosed are applicable to other types of nuclear devices and to imaging of body parts other than breasts as well as imaging of the whole body. Other applications that utilize these ideas and principles are within the spirit of this invention and fall within its scope.

1. Embodiment Where the Nuclear Imaging Device is Positioned Within the MRI Magnetic Field: Configuration #1

Figure 1:
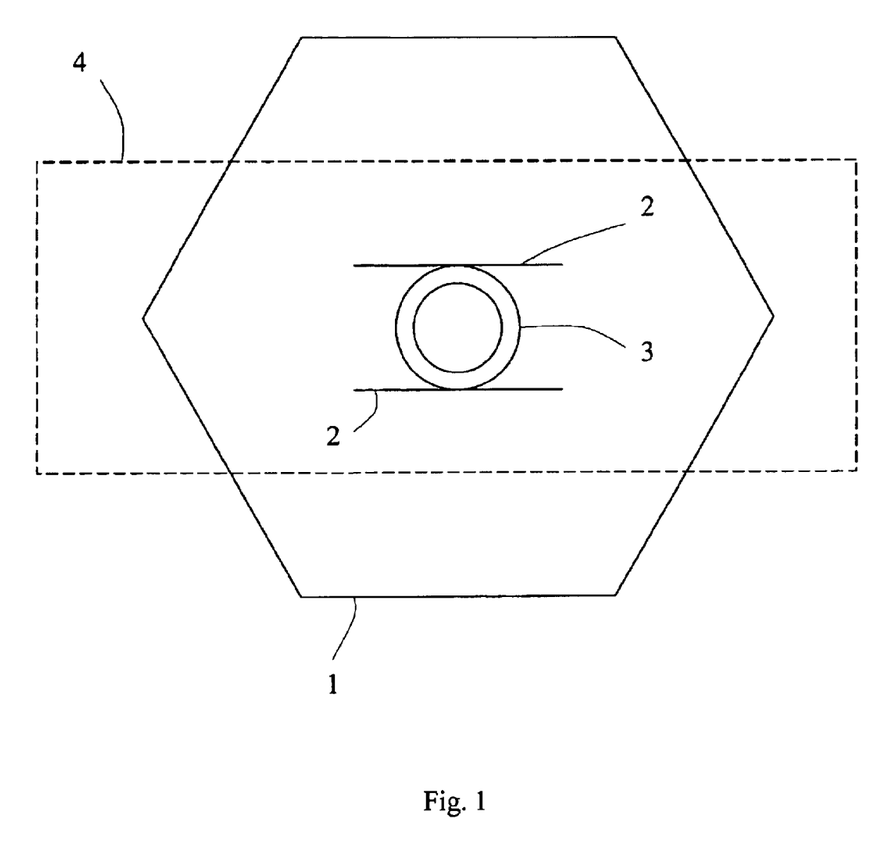
FIG. 1 is a top view showing a schematic representation of a first embodiment of the combined MRI-PET device of the present invention.
Figure 2:
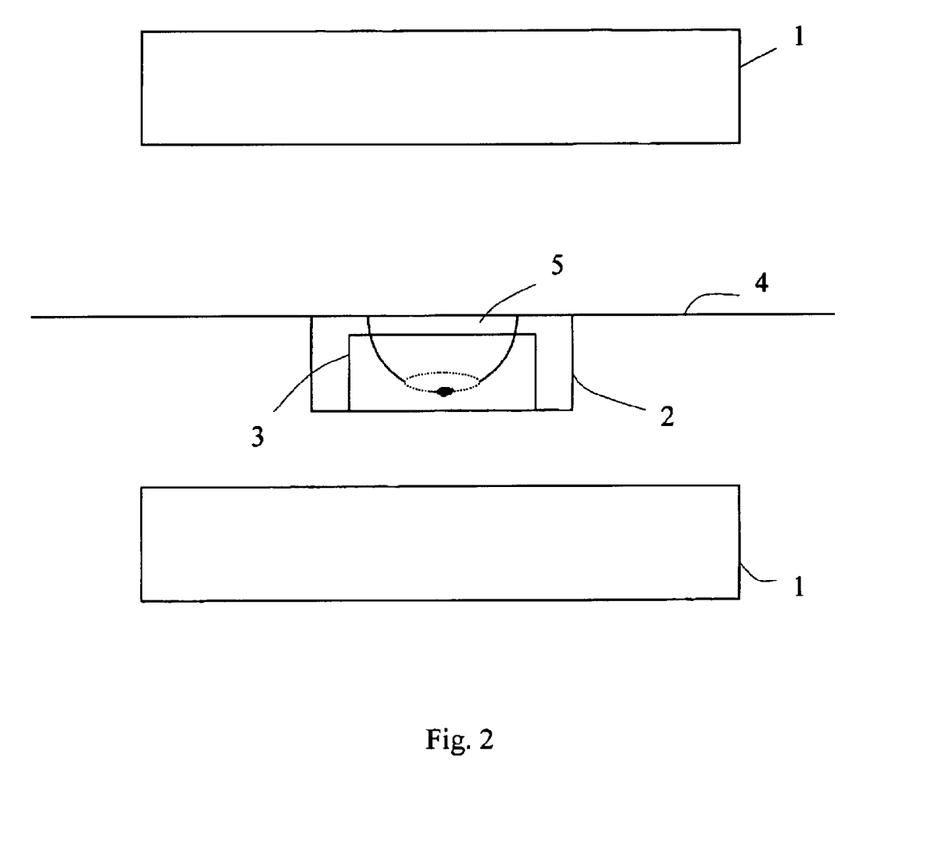
FIG. 2 is a side view of the combined MRI-PET of FIG. 1.

FIG. 1 is a schematic representation of an embodiment of the combined MRI-PET system for breast imaging. For ease of understanding only the relevant elements of the combined system are shown. The combined MRI-PET system includes a regular MRI device which includes an MRI magnet 1, and a coil 2 (such as a phase array coil). During an examination, the patient lies on her stomach on table 4 and inserts the breast to be imaged within the walls of the coil 2. In accordance with the present invention, a PET ring 3 is positioned within the walls of the coil 2 and surrounds the breast. FIG. 2 is a schematic representation showing a side view of the combined MRI-PET shown in FIG. 1. The PET ring 3 is electrically connected to a nuclear front-end stage (not shown). The coil 2 is electrically connected to an MRI front-end stage (not shown).

All other elements and connections between elements comprised in each of the MRI device and the PET device will be apparent to the skilled person and are not shown or described herein.

In the MRI-PET configuration of FIGS. 1 and 2, the MRI examination may be conducted simultaneously or quasi-simultaneously (in a biological time scale) without moving the patient. Thus, the MR image and the Nuclear image are taken in the same coordinate system, which greatly simplifies the combination of the images.

A similar configuration to the configuration shown in FIGS. 1 and 2 can be used for brain imaging. This configuration will be apparent to a person skilled in the art. Similarly, an architecture for imaging of the entire body may be designed using the same ideas and principles, and thus falls within the scope of this invention.

2. Embodiment Where the Nuclear Imaging Device is Positioned a Short Distance away from the Main Magnetic Field Configuration #2

Figure 3:
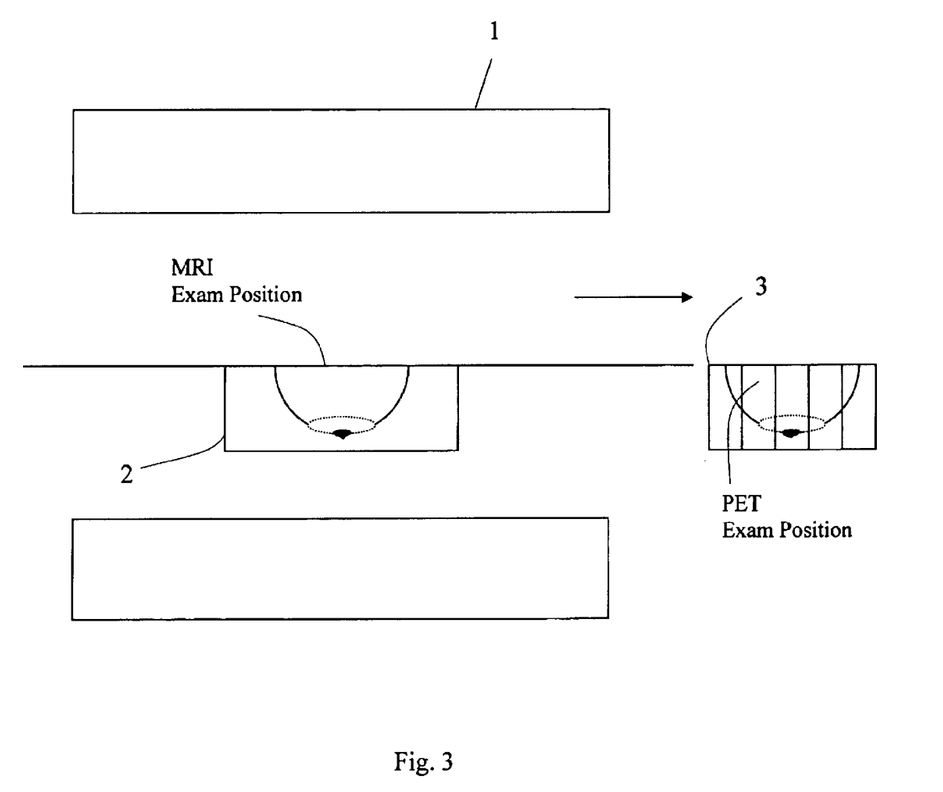
FIG. 3 is a side view of a schematic representation of a second embodiment of the present invention.

FIG. 3 is a schematic representation of an embodiment of the invention in configuration #2. The patient's breast is placed within the walls of the MRI coil 2, as is done during a regular MRI breast examination. The MRI system is activated and the MRI breast examination is conducted. The duration of a conventional MRI examination depends on the pulse frequency used. A standard breast examination in turbo regime typically takes about 7 minutes.

Once the MRI examination is completed, the breast is released from the coil 2 and the table is translated toward the PET ring 3 and the breast is inserted within the PET ring 3. This is preferably done without moving the patient with respect to the table. Since there is a known relationship between the coordinate system of the MRI coil and the coordinate system of the PET ring (inherent to the geometry of the combined device), and the position of the table is known with respect to either coordinate system, images acquired with either technique can easily be combined into a common coordinate system.

Preferably while still in the lying position the patient is injected with a radio active substance (typically $^{99}$Ts). Radioactive isotopes inside the breasts emit gamma quantums, which are detected by the NDMs of the PET ring 3, and a Nuclear image is acquired.

The MR image and Nuclear image acquired may then be combined. This combination is greatly facilitated by the fact that both images can be represented in a common coordinate system. Additionally, in a biological time scale, the two images can be considered to have been acquired at the same time.

3. PET Ring Architectures

Figure 7:
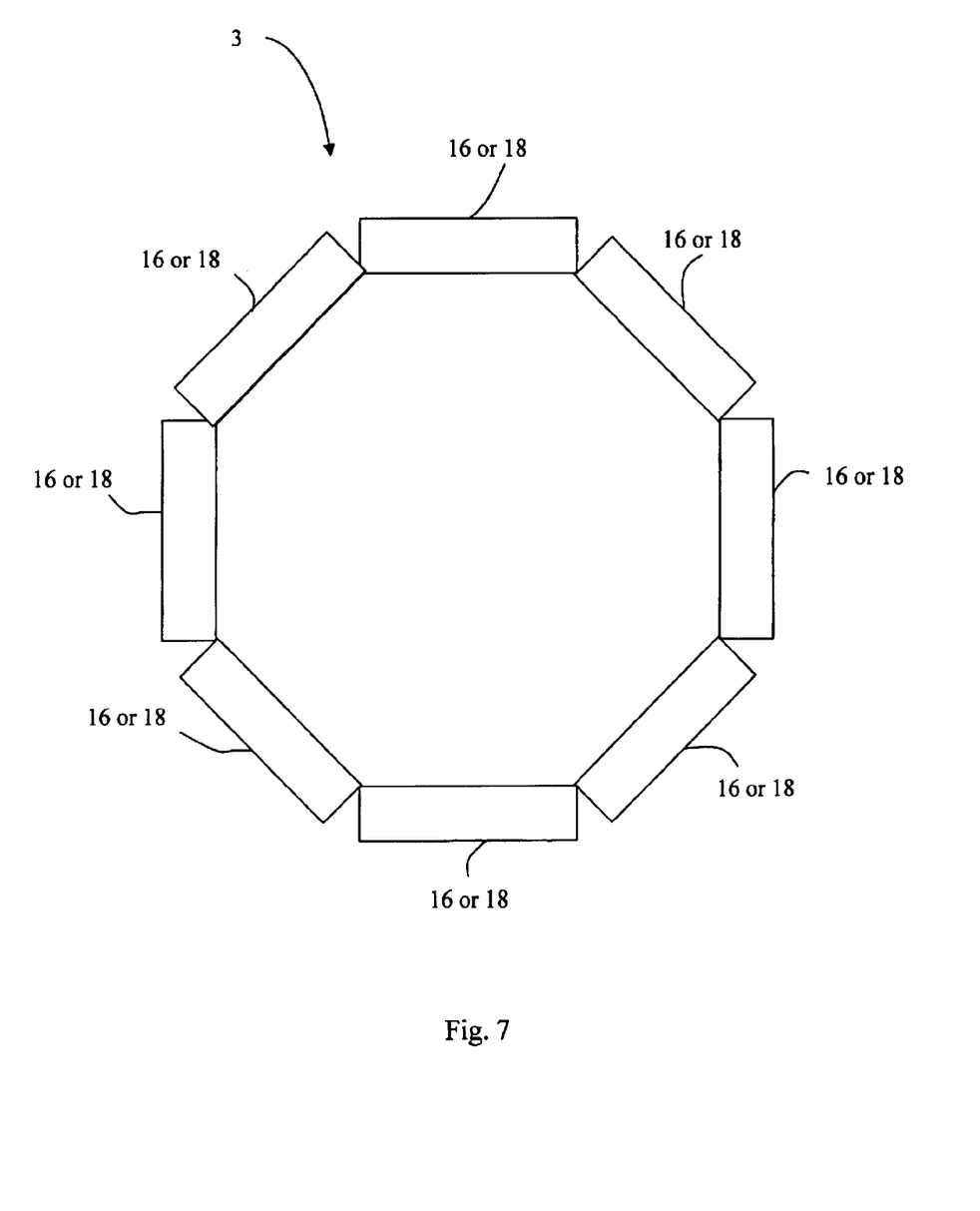
FIG. 7 is schematic representation of an embodiment of a PET ring in accordance with the present invention.

In a preferred embodiment, the PET ring includes 8 identical NDMs octagonally disposed as shown in FIG. 7. The general diameter of the ring may be about 10 cm for small animal imaging applications and about 43 cm for brain and breast imaging applications.

Depending on the application pursued, NDMs may include one or several HPD blocks (described below). For small animal imaging, each NDM may include a single HPD block. For brain, breast and full body imaging, each NDM may include 4 HPD blocks.

Figure 8:
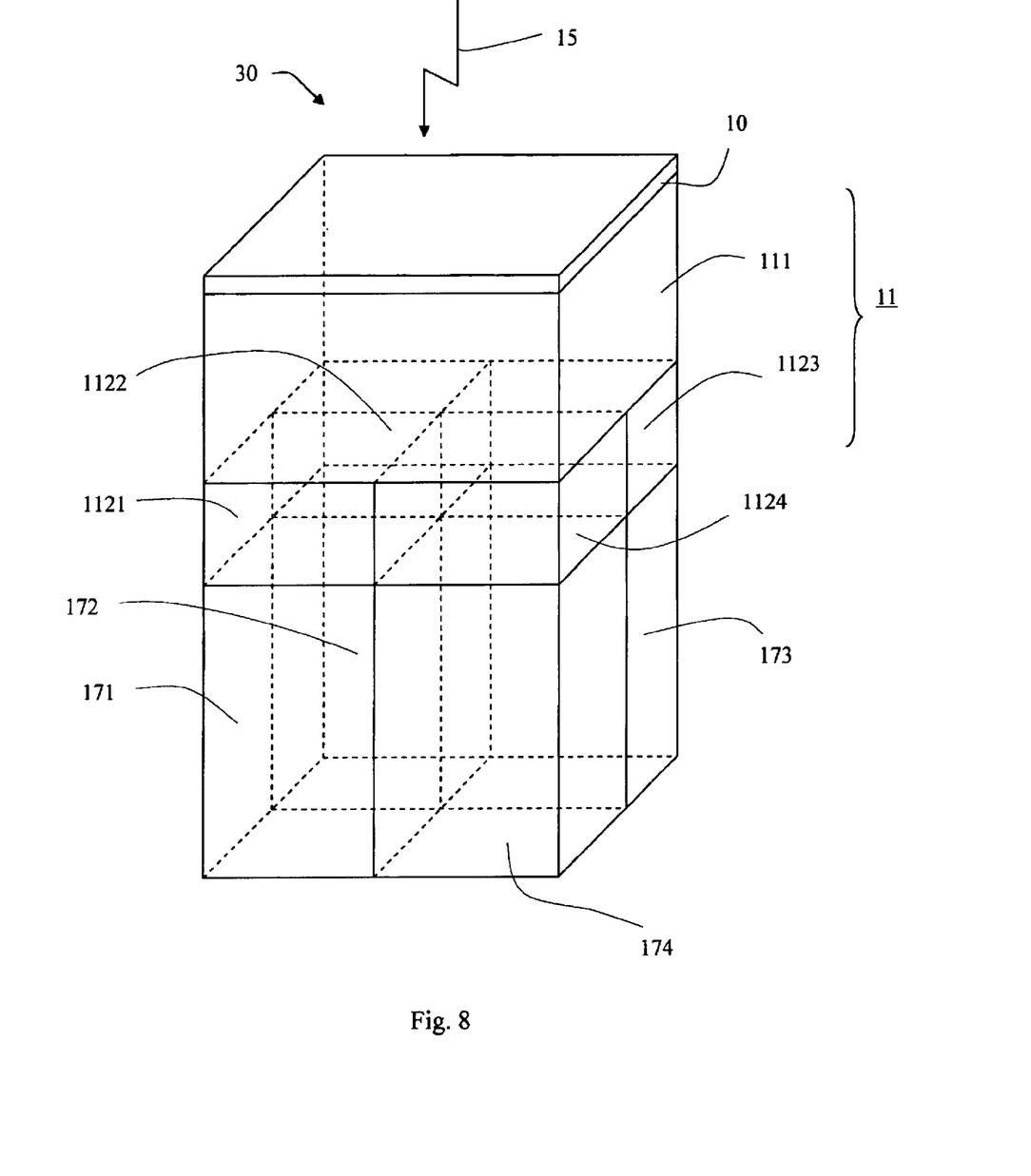
FIG. 8 is perspective view showing an embodiment of an NDM comprising 4 HPD blocks.

FIG. 8 shows a perspective representation of an NDM 30 comprising 4 HPD blocks 171, 172, 173 and 174. Each HPD block may include the commercial HPD mentioned above. In a preferred embodiment, the NDM 30 includes a scintillator 10 (having a 2-D matrix of pixels), a common light guide 11 comprising a common light guide 111 and 4 local light guides 1121, 1122, 1123 and 1124, and 4 HPD blocks 171, 172, 173 and 174, preferably disposed as shown in FIG. 8.

Figure 9:
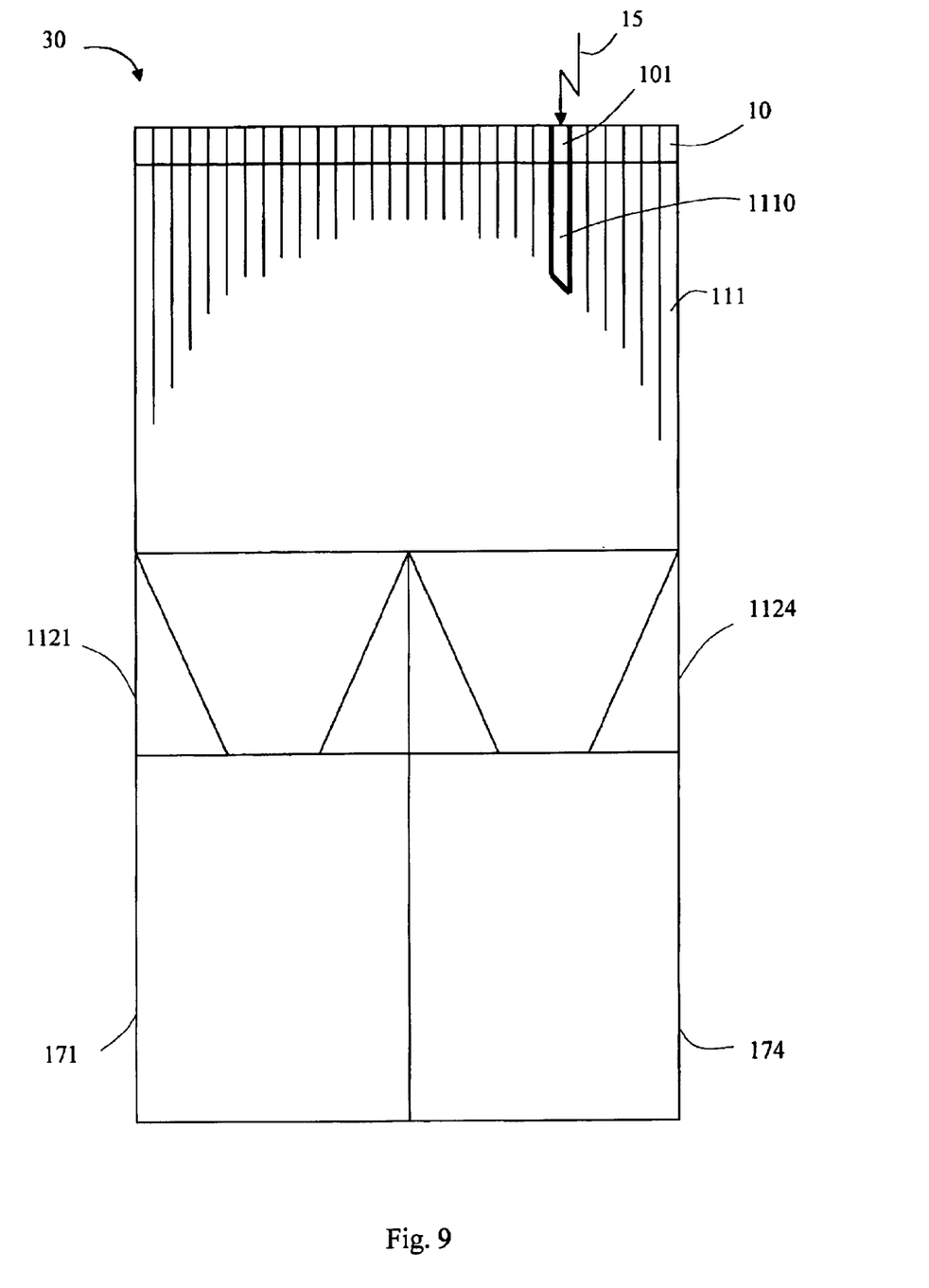
FIG. 9 is a front view of the NDM of FIG. 8.

FIG. 9 is a front view of the NDM 30 of FIG. 8. The common light guide 111 is preferably designed to have multiple channels each connected to one pixel or even a group of pixels. The design of the common light guide 111 may vary and many designs will suggest themselves to the skilled person. The light guide 111 is optically connected to the 4 local light guides 1121, 1122, 1123 and 1124 which act as funnels that direct the received photons into HPD blocks 171, 172, 173 and 174, respectively.

When a gamma quantum 15 hits a certain pixel 101 of the scintillator 10, a plurality of photons is generated. The majority of photon generated in pixel 101 will travel in the common light guide 111 through channel 1110 and its neighboring channels. These photons will then reach the local light guides 1121, 1122, 1123 and 1124 and will be distributed among the local light guides. This distribution will be a function of the location of the pixel which received the gamma quantum. The photons are then received by HPD blocks 171, 172, 173, and 174, and each HPD block outputs an electrical current representative of the number of photons received by the HPD block. By comparing the outputs of the HPD blocks (which represent the number of photons funneled through each local light guide 1121, 1122, 1123 and 1124), it is possible to determine which region of the scintillator received the gamma quantum or even which particular pixel received it, and a nuclear image can be constructed.

Referring back to FIG. 7, the width w of the NDMs may be about 86 mm in the case of breast and brain applications. For small animal applications, the width w may be about 43 mm.

Other architectures and configurations of the NDMs using the ideas and principles herein disclosed will suggest themselves to the person skilled art. As such, these architectures and configurations fall within the scope of this invention.

Although embodiments of the invention are described in the case where the nuclear imaging device is a PET device, the same ideas may be applied in the cases of gamma camera and SPECT devices.

Modifications of the combined MR-Nulcear imaging device and method thereof will suggest themselves to the skilled person. As such, this is invention is not to be limited to the disclosed embodiments except as required by the appended claims.

What is claimed is:

1. A combined MR-nuclear imaging device, comprising:
   a) a MRI device having a magnetic field associated therewith; and
   b) a nuclear imaging device disposed within the magnetic field, wherein the nuclear imaging device includes:
      a scintillator for detecting gamma quantums and outputting photons;
      a light guide coupled to the scintillator for channeling the photons; and
      at least one HPD coupled to the light guide for receiving the photons and outputting an electrical current representative of the gamma quantums received by the scintillator.

2. The combined MR-nuclear imaging device of claim 1 wherein the nuclear imaging device is a PET device.

3. The combined MR-nuclear imaging device of claim 2 wherein the PET device includes a PET ring, the PET ring comprising a plurality of Nuclear Detector Modules (NDMs).

4. The combined MR-nuclear imaging device of claim 3, wherein the MRI device has a RF coil, the RF coil having a plurality of surfaces, and wherein the PET ring is disposed in a space within the surfaces.

5. The combined MR-nuclear imaging device of claim 3, wherein each NDM comprises at least one HPD, wherein the HPD has a region where electrons are accelerated in a first direction, wherein the magnetic field has a second direction, and wherein the NDMs are arranged such that the first direction is aligned with the second direction.

6. The combined MR-nuclear imaging device of claim 3, wherein the light guide comprises a common light guide coupled to the scintillator for channeling the photons received from the scintillator, and a plurality of local light guides coupled to the common light guide, each local light guide channeling the photons received from the common light guide into a plurality of HPDs each of the HPDs being coupled to a corresponding local light guide.

7. The combined MR-nuclear imaging device of claim 6, wherein the photons output by the scintillator enter the light guide traveling in a first direction and exit the light guide traveling in a second direction, the second direction being substantially perpendicular to the first direction.

8. The combined MR-nuclear imaging device of claim 7, wherein a direction of the magnetic field is substantially parallel to the second direction.

9. The combined MR-nuclear imaging device of claim 3, wherein the PET ring comprises 8 NDMs disposed such that the planes of the scintillators are disposed so as to form an octagon.

10. The combined MR-nuclear imaging device of claim 9, wherein a general diameter of the octagon is suitable to fit a human breast within the octagon's periphery.

11. The combined MR-nuclear imaging device of claim 9, wherein a general diameter of the octagon is suitable to fit a human brain within the octagon's periphery.

12. The combined MR-nuclear imaging device of claim 1, wherein:
   a) the magnetic field has a magnitude which decreases with a radial distance from a center of the magnetic field where the magnetic field has a maximum magnitude M; and
   b) the nuclear imaging device is disposed in a region where the magnitude of the magnetic field is substantially M.

13. The combined MR-nuclear imaging device of claim 1, wherein:
   a) the magnetic field has a magnitude which decreases with a radial distance from a center of the magnetic field where the magnetic field has a maximum magnitude M; and
   b) the nuclear imaging device is disposed in a region where the magnitude of the magnetic field is greater than 0.5 M.

14. The combined MR-nuclear imaging device of claim 1, wherein:
   a) the magnetic field has a magnitude which decreases with a radial distance from a center of the magnetic field where the magnetic field has a maximum magnitude M; and b) the nuclear imaging device is disposed within a radial distance from the center of the magnetic field that is less than 20 centimeters.

15. The combined MR-nuclear imaging device of claim 1, wherein:
   a) the magnetic field has a magnitude which decreases with a radial distance from a center of the magnetic field where the magnetic field has a maximum magnitude M; and
   b) the nuclear imaging device is disposed within a radial distance from the center of the magnetic field that is less than 1 meter.

16. The combined MR-nuclear imaging device of claim 1, wherein:
   a) the magnetic field has a magnitude which decreases with a radial distance from a center of the magnetic field where the magnetic field has a maximum magnitude M; and
   b) the nuclear imaging device is disposed within a radial distance from the center of the magnetic field that is less than 2 meters.

17. The combined MR-nuclear imaging device of claim 1, wherein a first image generated by the MRI device and a second image generated by the nuclear imaging device are combined into a hybrid image.

18. The combined MR-nuclear imaging device of claim 17, wherein the PET device comprises a PET ring, the PET ring including a plurality of NDMs disposed so as to form a polygon, wherein each NDM comprises:
   a) a scintillator for detecting gamma quantums and outputting photons;
   b) a light guide coupled to the scintillator for channeling the photons, the light guide receiving photons traveling in a first direction and outputting the photons in a second direction which is substantially perpendicular to first direction; and
   c) at least one HPD coupled to the light guide for receiving the photons traveling in the second direction and outputting an electrical current representative of the gamma quantums received by the scintillator;

wherein the second direction is substantially parallel to a direction of the magnetic field.

* * * * *